(12) United States Patent
Chung

(10) Patent No.: US 10,417,958 B2
(45) Date of Patent: Sep. 17, 2019

(54) PIXEL STRUCTURE, DISPLAY DEVICE AND DRIVING METHOD

(71) Applicant: BOE TECHNOLOGY GROUP CO., LTD., Beijing (CN)

(72) Inventor: Chiehhsing Chung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 112 days.

(21) Appl. No.: 15/501,421

(22) PCT Filed: Apr. 26, 2016

(86) PCT No.: PCT/CN2016/080207
§ 371 (c)(1),
(2) Date: Feb. 2, 2017

(87) PCT Pub. No.: WO2017/133088
PCT Pub. Date: Aug. 10, 2017

(65) Prior Publication Data
US 2018/0182284 A1    Jun. 28, 2018

(30) Foreign Application Priority Data
Feb. 4, 2016   (CN) .......................... 2016 1 0080263

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *H01L 27/3211* (2013.01);
(Continued)

(58) Field of Classification Search
None
See application file for complete search history.

(56) References Cited

U.S. PATENT DOCUMENTS

| 9,331,300 B2 * | 5/2016 | Moon ..................... H01L 51/52 |
| 2007/0103405 A1 * | 5/2007 | Kwak .................. G09G 3/3233 345/76 |
| 2015/0208480 A1 * | 7/2015 | Hosokawa .......... H01L 27/3209 315/294 |

FOREIGN PATENT DOCUMENTS

| CN | 1737892 A | 2/2006 |
| CN | 1959790 A | 5/2007 |

(Continued)

OTHER PUBLICATIONS

Office Action in Chinese Application No. 201610080263.7 dated Dec. 2, 2016, with English translation. 10 pages.
(Continued)

*Primary Examiner* — Kenneth B Lee, Jr.
(74) *Attorney, Agent, or Firm* — Womble Bond Dickinson (US) LLP

(57) ABSTRACT

A pixel structure is disclosed which includes a first light-emitting device, a second light-emitting device, a common driving unit, a first driving transistor, a second driving transistor, a first switch unit operably coupled between the first driving transistor and the first light-emitting device, and a second switch unit operably coupled between the second driving transistor and the second light-emitting device. The second driving transistor has a channel width-to-length ratio smaller than that of the first driving transistor. The first switch unit and the second switch unit are configured to turn on time-divisionally. Also disclosed are a display device and a method for driving the pixel structure.

14 Claims, 9 Drawing Sheets

(51) Int. Cl.
   *H01L 27/32* (2006.01)
   *H01L 27/12* (2006.01)
   *H01L 29/786* (2006.01)

(52) U.S. Cl.
   CPC . *H01L 27/3262* (2013.01); *G09G 2300/0804* (2013.01); *G09G 2300/0814* (2013.01); *G09G 2300/0847* (2013.01); *G09G 2300/0852* (2013.01); *G09G 2300/0861* (2013.01); *G09G 2310/0235* (2013.01); *G09G 2320/064* (2013.01); *H01L 27/1251* (2013.01); *H01L 29/78696* (2013.01)

(56)    References Cited

FOREIGN PATENT DOCUMENTS

CN    103708253 A    7/2013
   CN    105513534 A    4/2016
   JP    2007108247 A   4/2007

OTHER PUBLICATIONS

International Search Report and Written Opinion in PCT/CN2016/080207 dated Oct. 31, 2016, with English translation. 15 pages.
Office Action in Chinese Application No. 201610080263.7 dated Apr. 28, 2017, with English translation.

\* cited by examiner

PIXEL STRUCTURE, DISPLAY DEVICE AND DRIVING METHOD

REFERENCE TO THE RELATED APPLICATIONS

The present application is the U.S. national phase entry of PCT/CN2016/080207, with an international filing date of Apr. 26, 2016, which claims the benefit of Chinese Patent Application No. 201610080263.7 filed Feb. 4, 2016, the entire disclosures of which are incorporated herein by reference.

TECHNICAL FIELD

The present disclosure relates to the field of display technologies, and particularly to a pixel structure, a display device and a driving method.

BACKGROUND

In a display device based on light-emitting devices (e.g., organic light-emitting diodes), a pixel structure generally includes a plurality of sub-pixel structures, each of which includes a light-emitting device. With different light-emitting devices typically having different driving requirements, these sub-pixel structures each have their own driving circuits. This requires a large footprint for the driving circuit. The higher the resolution of the display device is, the larger the footprint is.

SUMMARY

It would be advantageous to achieve a pixel structure that has a reduced footprint for the driving circuit. It would also be desirable to provide a display device including the pixel structure and a method for driving the pixel structure.

According to an aspect of the present disclosure, a pixel structure is provided which comprises: a first light-emitting device; a second light-emitting device having a different driving requirement from the first light-emitting device; a common driving unit; a first driving transistor operably coupled to the common driving unit for driving the first light-emitting device; a second driving transistor operably coupled to the common driving unit for driving the second light-emitting device; a first switch unit operably coupled between the first driving transistor and the first light-emitting device; and a second switch unit operably coupled between the second driving transistor and the second light-emitting device. The second driving transistor has a channel width-to-length ratio smaller than that of the first driving transistor. The channel width-to-length ratio of the second driving transistor is adapted to the driving requirement of the second light-emitting device. The first switch unit and the second switch unit are configured to turn on time-divisionally.

In some embodiments, the first driving transistor and the second driving transistor are independent from each other.

In some embodiments, the first driving transistor has a first channel region, the second driving transistor has a second channel region, and the first channel region is reused as a part of the second channel region.

In some embodiments, the first driving transistor and the second driving transistor have a common gate electrode and a common first electrode, the first driving transistor has a second electrode, the second driving transistor has a second electrode, the first channel region provides an electrical connection between the common first electrode and the second electrode of the first driving transistor when being conductive, and the second channel region provides an electrical connection between the common first electrode and the second electrode of the second driving transistor when being conductive.

In some embodiments, the first driving transistor and the second driving transistor are of a bottom gate type.

In some embodiments, the first driving transistor and the second driving transistor are of a top gate type.

In some embodiments, the common gate electrode comprises a first part and a second part that are spaced from each other in a length direction of the first channel region and the second channel region. The first part defines an effective length of the first channel region. The first part together with the second part defines an effective length of the second channel region.

In some embodiments, the pixel structure further comprises a third light-emitting device having the same driving requirement as the first light-emitting device, and a third switch unit operably coupled between the first driving transistor and the third light-emitting device. The first switch unit, the second switch unit and the third switch unit are configured to turn on time-divisionally.

In some embodiments, the first light-emitting device is a red OLED, the second light-emitting device is a blue OLED, and the third light-emitting device is a green OLED.

According to another aspect of the present disclosure, a display device is provided which comprises the pixel structure as described above.

According to yet another aspect of the present disclosure, a method is provided for driving the pixel structure as described above. The method comprises: controlling the first switch unit and the second switch unit to turn on time-divisionally; driving, by the common driving unit and the first driving transistor, the first light-emitting device to emit light when the first switch unit is turned on; and driving, by the common driving unit and the second driving transistor, the second light-emitting device to emit light when the second switch unit is turned on.

In some embodiments, the pixel structure further comprises a third light-emitting device having the same driving requirement as the first light-emitting device and a third switch unit operably coupled between the first driving transistor and the third light-emitting device. The method further comprises: controlling the first switch unit, the second switch unit and the third switch unit to turn on time-divisionally; and driving, by the common driving unit and the first driving transistor, the third light-emitting device to emit light when the third switch unit is turned on.

According to embodiments of the present disclosure, different driving requirements of different light-emitting devices in the pixel structure may be fulfilled by providing driving transistors with different channel width-to-length ratios, and the footprint of the driving circuit may be reduced by sharing a part of the driving circuit among the light-emitting devices.

DETAILED DESCRIPTION

The present disclosure will now be described more thoroughly with reference to the accompanying drawings in which exemplary embodiments of the present disclosure are shown. The present disclosure however can be implemented in a variety of ways, and should not be construed as being limited to the embodiments described herein. Rather, these embodiments are provided such that the present disclosure is elaborate and complete, and fully conveys the scope of the present disclosure to a person having ordinary skill in the art.

For a better understanding of the embodiments of the present disclosure, some terms used herein and the basic concept of the present disclosure are explained first.

Driving Requirement

For an active light-emitting device such as an active matrix organic light-emitting diode (AMOLED) or an electroluminescent display device, its luminance depends on the magnitude of the current flowing through the light-emitting device. This dependency between the luminance and the magnitude of the current is herein referred to as a "driving requirement".

Assume a light-emitting device A and a light-emitting device B wherein the light-emitting device A exhibits a luminance of L1 under the driving of a current X1 and the light-emitting device B requires a driving current of X2 for the same luminance L1, then the light-emitting device A and the light-emitting device B are regarded as having different driving requirements.

The driving requirement of a light-emitting device is highly relevant to the parameters and performance of the driving transistor. In embodiments of the present disclosure, different driving requirements of different light-emitting devices are met by providing driving transistors with different channel width-to-length ratios.

For each grayscale (which corresponds to a respective target luminance), the driving chip of a display device would "translate" it into a voltage signal that is to be applied to the driving transistor. This voltage signal, together with other signals including the power supply voltage, influences the driving current of the driving transistor. The driving current at length flows through the light-emitting device connected in series with the driving transistor.

For different driving transistors, the same grayscale represents the same input. Owing to different channel width-to-length ratios of the driving transistors, the same input may result in different outputs (driving currents). These different driving currents are adapted to the driving requirements of individual light-emitting devices such that the light-emitting devices exhibit the same luminance when emitting light.

In addition, in embodiments of the present disclosure, apart from the driving transistors and their respective switch units, other parts of the driving circuit are shared by two or more light-emitting devices. Different driving transistors and the common part of the driving circuit cooperate to drive different light-emitting devices.

Figure 1A:
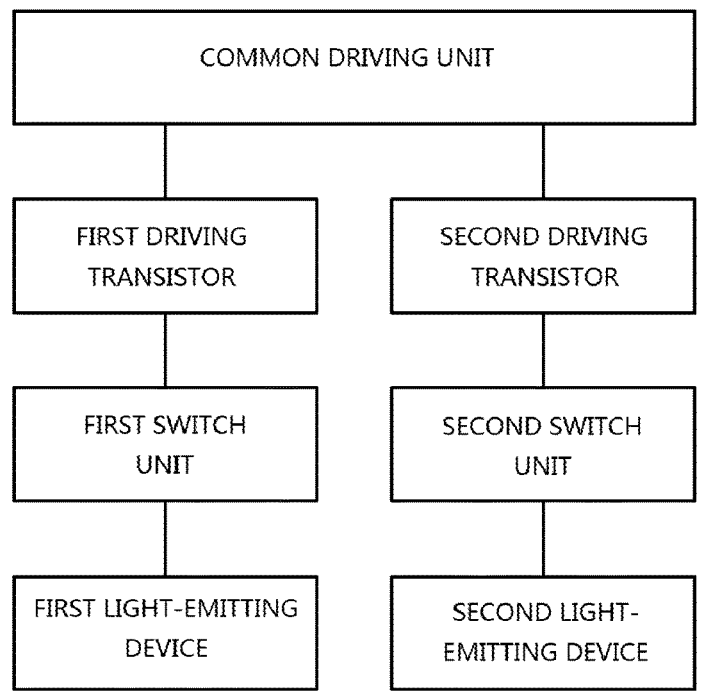
FIG. 1*a* is a schematic block diagram of a pixel structure according to an embodiment of the present disclosure.

FIG. 1a is a schematic block diagram of a pixel structure according to an embodiment of the present disclosure.

Referring to FIG. 1a, the pixel structure includes a first light-emitting device, a second light-emitting device, a common driving unit, a first driving transistor, a second driving transistor, a first switch unit, and a second switch unit.

The second light-emitting device has a different driving requirement than the first light-emitting device.

The common driving unit is operable to form a driving circuit with either of the first driving transistor and the second driving transistor to drive the first light-emitting device or the second light-emitting device.

The first driving transistor is operably coupled to the common driving unit for driving the first light-emitting device, and the second driving transistor is operably coupled to the common driving unit for driving the second light-emitting device. The second driving transistor has a channel width-to-length ratio smaller than that of the first driving transistor. The channel width-to-length ratio of the second driving transistor is adapted to the driving requirement of the second light-emitting device The first switch unit is operably coupled between the first driving transistor and the first light-emitting device, and the second switch unit is operably coupled between the second driving transistor and the second light-emitting device. The first switch unit and the second switch unit are configured to turn on time-divisionally.

As the common driving unit is shared by the first light-emitting device and the second light-emitting device, cooperation of the first switch unit and the second switch unit is necessary to allow the first light-emitting device and the second light-emitting device to operate in different periods of time, thus avoiding interference between different light-emitting devices. This requires additional timing control, which is however not the inventive aspect of this disclosure, and thus is not described herein in detail.

Due to the existence of the common driving unit, the footprint of the driving circuit may be reduced, as will be discussed later in connection with specific circuits. The reduction of the footprint of the driving circuit would provide additional advantages such as an increased aperture ratio and an increased resolution.

Referring still to FIG. 1a, in this pixel structure, the first driving transistor and the second driving transistor are independent from each other. Specifically, the common driving unit, the first driving transistor, the first switch unit and the first light-emitting device form a first working path, and the common driving unit, the second driving transistor, the second switch unit and the second light-emitting device form a second working path.

Fabricating the first driving transistor and the second driving transistor independently from each other allows precise control of their respective channel width-to-length ratios. However, the first driving transistor and the second driving transistor may use a shared channel in order for a further reduction of the footprint of the driving circuit.

Figure 1B:
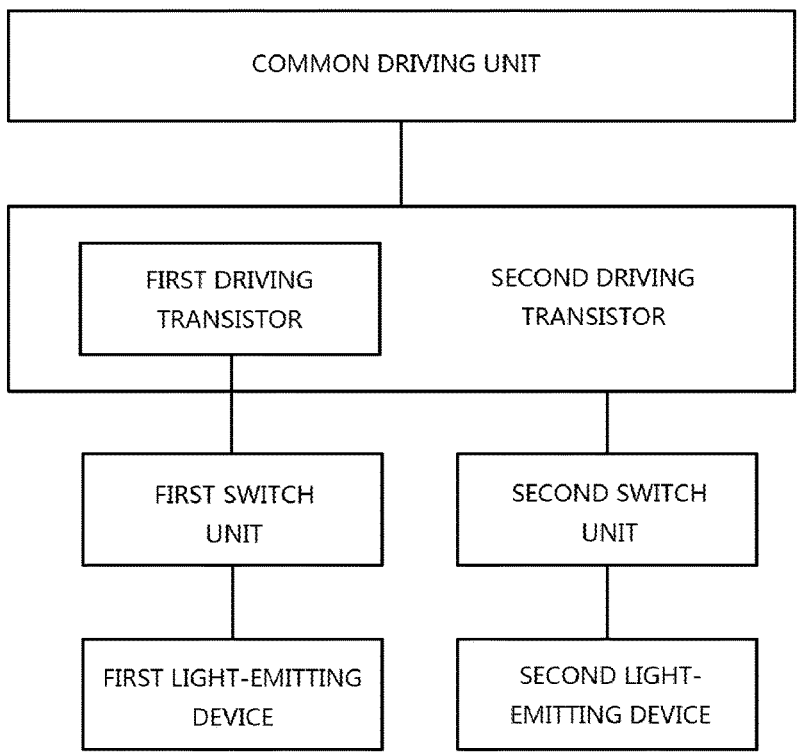
FIG. 1*b* is a schematic block diagram of another pixel structure according to an embodiment of the present disclosure.

FIG. 1b shows a schematic block diagram of such a pixel structure. Specifically, in this pixel structure, the channel of the first driving transistor is reused as a part of the channel of the second driving transistor.

Such driving transistors are described below in more detail with reference to FIGS. 2a, 2b and 2c.

Figure 2A:
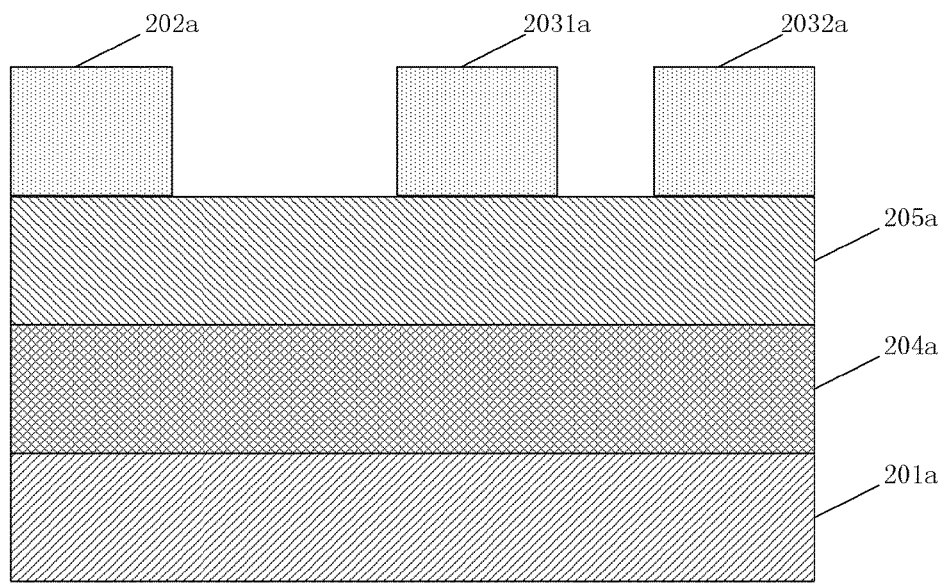
FIG. 2a is a schematic cross-sectional view of a driving transistor having a shared channel region in a pixel structure according to an embodiment of the present disclosure.

FIG. 2a is a schematic cross-sectional view of a driving transistor having a shared channel region in a pixel structure according to an embodiment of the present disclosure.

Referring to FIG. 2a, the first driving transistor includes a common gate electrode 201a, a common gate insulation layer 204a, a common semiconductor layer 205a, a common first electrode 202a and a second electrode 2031a, and the second driving transistor includes the common gate electrode 201a, the common gate insulation layer 204a, the common semiconductor layer 205a, the common first electrode 202a and a second electrode 2032a.

In the case that the first driving transistor and the second driving transistor are N-type transistors, the common first electrode 202a is a drain electrode, and the second electrodes 2031a and 2032a are source electrodes. In the case that the first driving transistor and the second driving transistor are P-type transistors, the common first electrode 202a is a source electrode, and the second electrodes 2031a and 2032a are drain electrodes.

Part of the common semiconductor layer 205a between the common first electrode 202a and the second electrode 2031a forms a first channel region which provides an electrical connection between the common first electrode 202a and the second electrode 2031a when being conductive. Similarly, part of the common semiconductor layer 205a between the common first electrode 202a and the second electrode 2032a forms a second channel region which provides an electrical connection between the common first electrode 202a and the second electrode 2032a when being conductive.

As shown in FIG. 2a, the distance between the second electrode 2032a and the common first electrode 202a is larger than the distance between the second electrode 2031a and the common first electrode 202a. This means that the length of the second channel region is larger than that of the first channel region. Thus, with the same width, the second driving transistor has a channel width-to-length ratio smaller than that of the first driving transistor.

Relative positions of the gate electrode, the source electrode, the drain electrode, the gate insulation layer and the semiconductor layer as well as the fabrication process thereof are known, and are not described herein in detail.

Although the driving transistors as shown in FIG. 2a are of a bottom gate type, the first driving transistor and the second driving transistor may also be a top gate type.

Figure 2B:
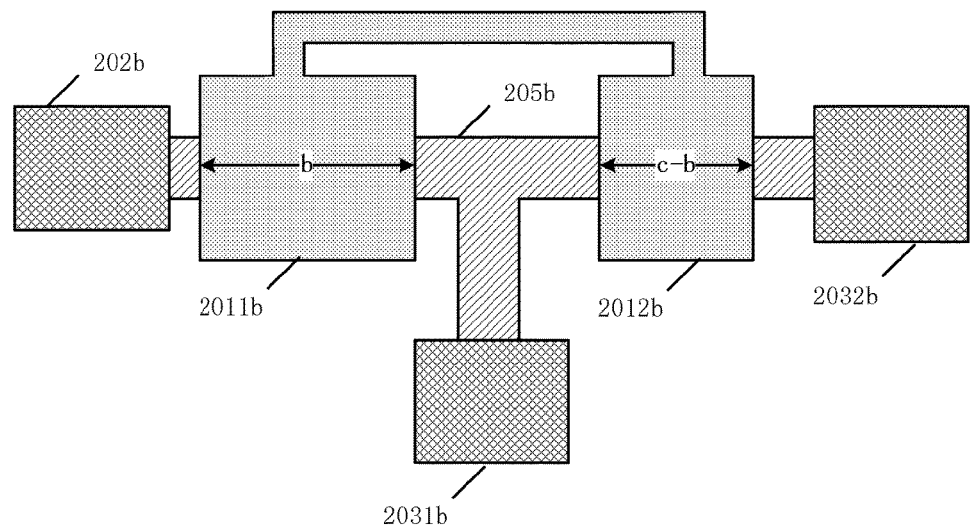
FIG. 2b is a schematic cross-sectional view of another driving transistor having a shared channel region in a pixel structure according to an embodiment of the present disclosure.

FIG. 2b is a schematic plan view showing such driving transistors.

Referring to FIG. 2b, the first driving transistor includes a first part 2011b of a common gate electrode, a common gate insulation layer (not shown), a common first electrode 202b, a second electrode 2031b and a common semiconductor layer 205b, and the second driving transistor includes a second part 2012b of the common gate electrode, the common gate insulation layer (not shown), the common first electrode 202b, a second electrode 2032b and the common semiconductor layer 205b.

Similar to the example as shown in FIG. 2a, the distance between the second electrode 2032b and the common first electrode 202b is larger than the distance between the second electrode 2031b and the common first electrode 202b.

In the example as shown in FIG. 2b, the common gate electrode includes a first part 2011b and a second part 2012b that are spaced from each other. The first part 2011b and the second part 2012b are connected by an additional part which does not overlap the common semiconductor layer 205b. The first part 2011b defines an effective length of the first channel region, and the first part 2011b together with the second part 2012b defines an effective length of the second channel region. As shown in FIG. 2b, the effective length of the channel of the first driving transistor is b, and the effective length of the channel of the first driving transistor is b+c−b=c.

Figure 2C:
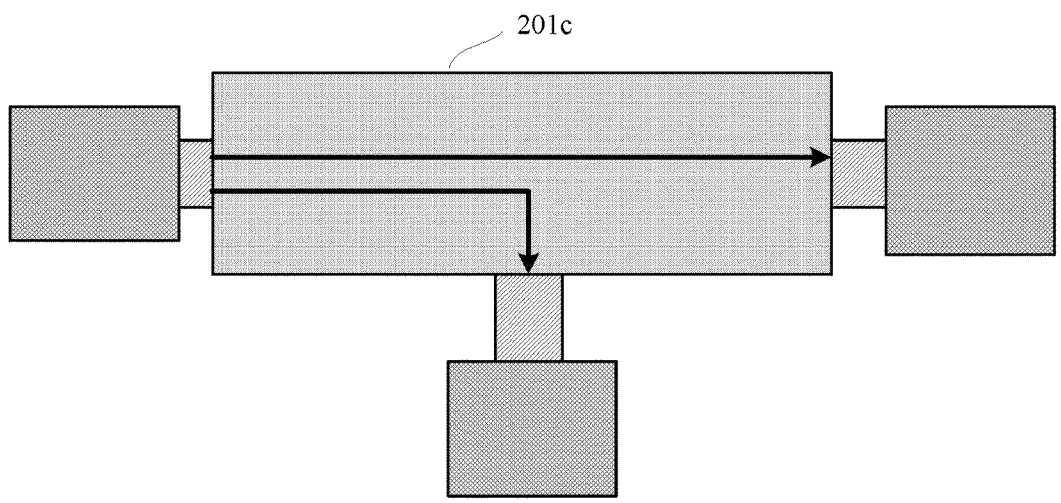
FIG. 2c is a schematic cross-sectional view of yet another driving transistor having a shared channel region in a pixel structure according to an embodiment of the present disclosure.

FIG. 2c is a schematic cross-sectional view of yet another driving transistor having a shared channel region in a pixel structure according to an embodiment of the present disclosure.

As compared with the driving transistors as shown in FIG. 2b, the common gate electrode 201c in FIG. 2c covers a T-shape region between the first part 2011b and the second part 2012b. The common gate electrode 201c is sized such that each of the first driving transistor and the second driving transistor has a desired width-to-length ratio.

In the examples as shown in FIGS. 2a, 2b and 2c, the channel of the first driving transistor is reused as the channel of the second driving transistor. This reduces the footprint of the first driving transistor and the second driving transistor, and thus the footprint of the driving circuit.

In addition, as shown in FIG. 2a, since the second electrodes 2031a and 2032a are formed in the same layer, the first and second driving transistors may be formed by one-time patterning, thus simplifying the process.

In other exemplary embodiments, after the formation of the second driving transistor, a lead wire may be lead out at an appropriate position of the second channel region, which lead wire will be used as the second electrode of the first driving transistor.

Embodiments where one pixel structure includes two sub-pixels have been described above. Embodiments where one pixel structure includes three or more sub-pixel structures are described below.

In some embodiments, the light-emitting device of each of the sub-pixel structures has a different driving requirement. In this case, each of the sub-pixel structures may be provided with a respective driving transistor and switch unit, while the rest of the driving circuit is shared.

In some embodiments, the light-emitting devices of some of the sub-pixels have the same driving requirement, and the light-emitting devices of other sub-pixel structures have different driving requirements.

For example, assume three sub-pixel structures D1, D2 and D3, wherein the light-emitting devices in the sub-pixel structures D1 and D2 have the same driving requirement, and the light-emitting device in the sub-pixel structure D3 has a different driving requirement.

In this case, in some exemplary embodiments, one of the sub-pixel structures D1 and D2 and the sub-pixel structure D3 may be implemented based on the architecture as shown in FIG. 1a or 1b, and the other of the sub-pixel structures D1 and D2 may be implemented independently.

In some exemplary embodiments, the light-emitting devices having the same driving requirement may share the same driving transistor, so as to further reduce the footprint of the driving circuit.

Such embodiments are described below with reference to FIGS. 3a and 3b.

Figure 3A:
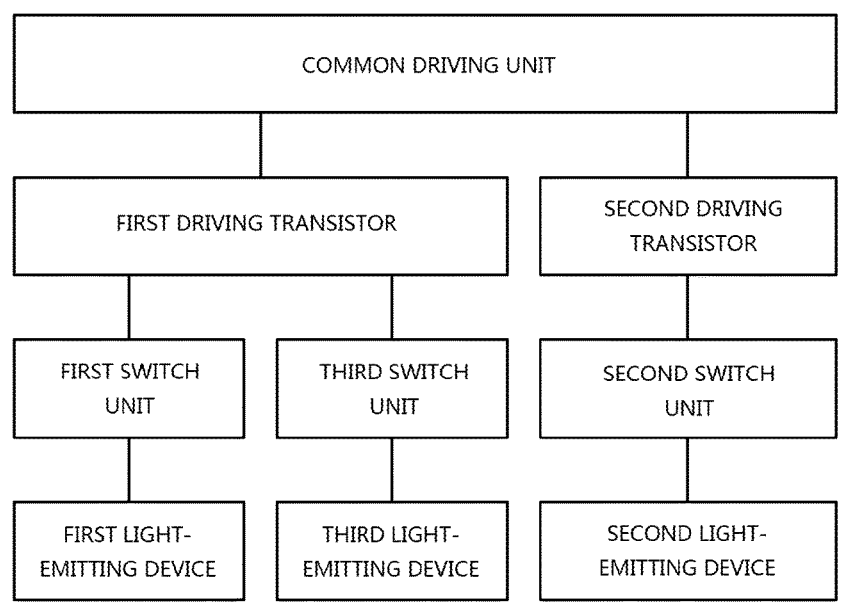
FIG. 3a is a schematic block diagram of a pixel structure according to an embodiment of the present disclosure.

Referring to FIG. 3a, in addition to the components as described in connection with FIG. 1a, the pixel structure includes a third light-emitting device and a third switch unit. The third light-emitting device has the same driving requirement as the first light-emitting device. The third switch unit is operably coupled between the first driving transistor and the third light-emitting device. The first switch unit, the second switch unit and the third switch unit are configured to turn on time-divisionally.

In the example as shown in FIG. 3a, the first driving transistor and the second driving transistor are independent from each other. However, in some embodiments, the first driving transistor and the second driving transistor may use a shared channel, so as to further reduce the footprint of the driving circuit.

Figure 3B:
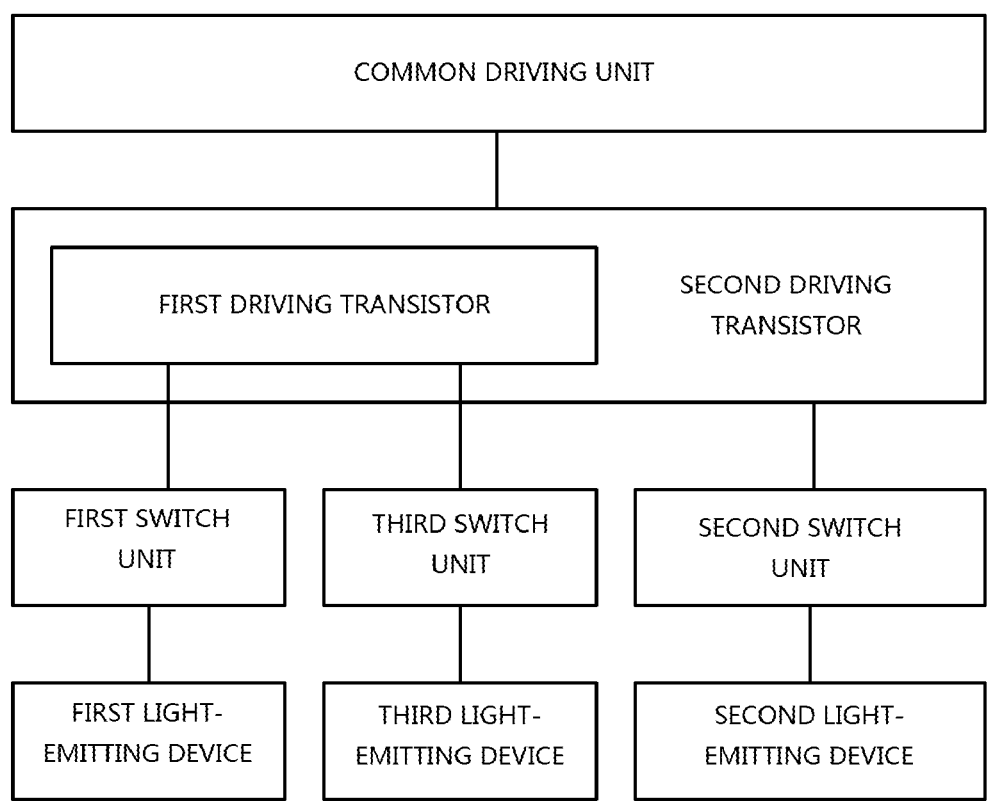
FIG. 3b is a schematic block diagram of another pixel structure according to an embodiment of the present disclosure.

FIG. 3b is a schematic block diagram showing such a pixel structure. In this pixel structure, the channel of the first driving transistor is reused as a part of the channel of the second driving transistor.

In an exemplary embodiment, the first light-emitting device is a red OLED, the second light-emitting device is a blue OLED, and the third light-emitting device is a green OLED, although other embodiments are possible.

Embodiments of the present disclosure are further described in connection with FIGS. 4a to 4d.

FIGS. 4a to 4d are circuit schematics of a pixel structure including driving transistors having a shared channel region, according to an embodiment of the present disclosure. By way of example, and not limitation, in these embodiments, one pixel structure includes two sub-pixel structures, the first light-emitting device and the second light-emitting device have different driving requirements, and the first driving transistor and the second driving transistor use a shared channel.

Figure 4A:
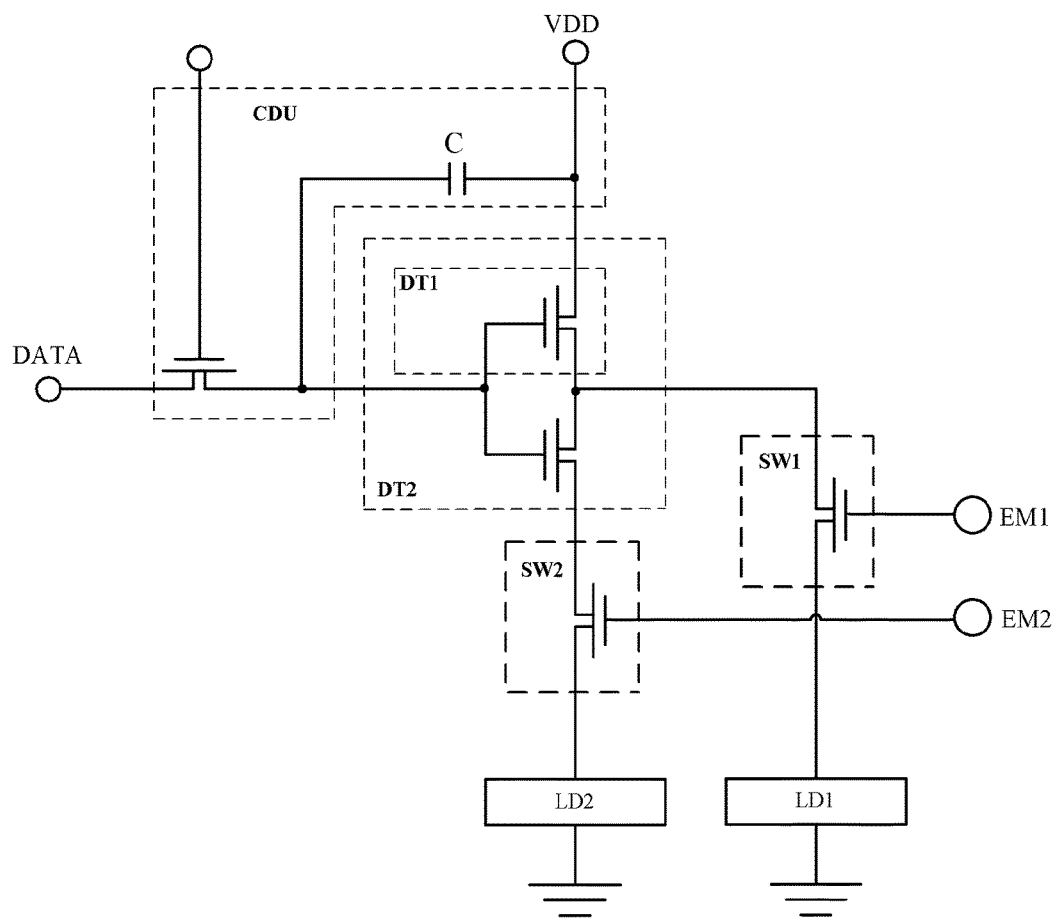
FIGS. 4a to 4d are circuit schematics of a pixel structure including driving transistors having a shared channel region, according to an embodiment of the present disclosure.

The pixel structure as shown in FIG. 4a includes a first light-emitting device LD1, a second light-emitting device LD2, a common driving unit CDU, a first driving transistor DT1, a second driving transistor DT2, a first switch unit SW1 and a second switch unit SW2.

In an operation period of the first light-emitting device LD1, the first switch unit SW1 is turned on under control of EM1, and the second switch unit SW2 is turned off under control of EM2. Under control of driving signals (including a data voltage signal DATA, a power supply signal VDD, a gate scan signal, etc.) which are applied to the common driving unit CDU, the first light-emitting device LD1 emits light.

In an operation period of the second light-emitting device LD2, the first switch unit SW1 is turned off under control of EM1, and the second switch unit SW2 is turned on under control of EM2. Under control of driving signals (including a data voltage signal DATA, a power supply signal VDD, a gate scan signal, etc.) which are applied to the common driving unit CDU, the second light-emitting device LD2 emits light.

Figure 4B:
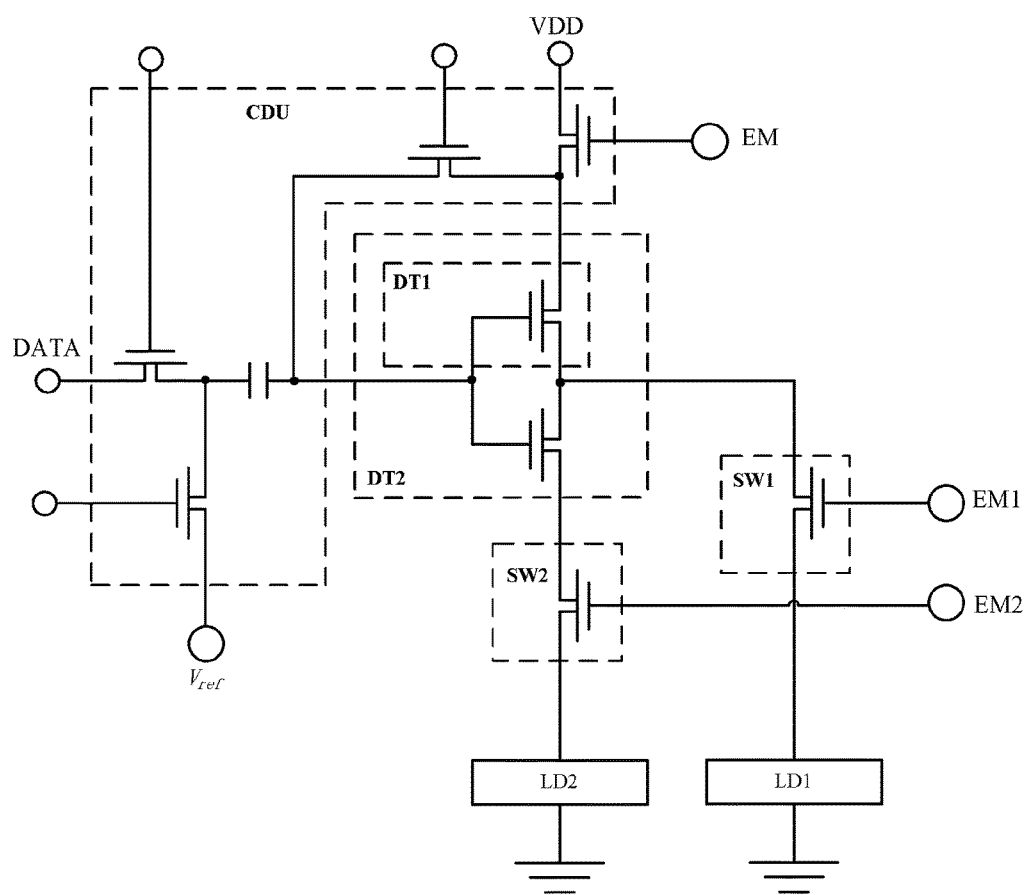

The pixel structure as shown in FIG. 4b includes a first light-emitting device LD1, a second light-emitting device LD2, a common driving unit CDU, a first driving transistor DT1, a second driving transistor DT2, a first switch unit SW1 and a second switch unit SW2.

In an operation period of the first light-emitting device LD1, the first switch unit SW1 is turned on under control of EM1, and the second switch unit SW2 is turned off under control of EM2. Under control of driving signals (including a data voltage signal DATA, a power supply signal VDD, a gate scan signal, a reference signal $V_{ref}$ etc.) which are applied to the common driving unit CDU, the first light-emitting device LD1 emits light.

In an operation period of the second light-emitting device LD2, the first switch unit SW1 is turned off under control of EM1, and the second switch unit SW2 is turned on under control of EM2. Under control of driving signals (including a data voltage signal DATA, a power supply signal VDD, a gate scan signal, a reference signal $V_{ref}$, etc.) which are applied to the common driving unit CDU, the second light-emitting device LD2 emits light.

In the following, how the footprint of the driving circuit is reduced by using the pixel structure according to embodiments of the present disclosure is explained with reference to the example circuit as shown in FIG. 4b.

Assume that an average footprint of the transistors is C1, an average footprint of the capacitors is C2, and one pixel structure includes three sub-pixel structures.

Where the pixel structure according to embodiments of the present disclosure is not used, the footprint of the driving circuit of a single sub-pixel structure is 5C1+C2. For three sub-pixel structures, the total footprint is 3*(5C1+C2)=15C1+3C2.

In the case of pixel structure as shown in FIG. 4b, the footprint of the driving circuit includes the following portions:
  the footprint of the common driving unit CDU (including four transistors and one capacitor): 4C1+C2;
  the footprint of the first and second driving transistors: 2C1;
  the footprint of the driving circuit of the third sub-pixel structure: 5C1+C2; and
  the footprint of the first and second switch units added: 2C1.

Thus, the total footprint of the driving circuit is 13C1+2C2. As compared with 15C1+3C2, the footprint is reduced by 2C1+C2.

Figure 4C:
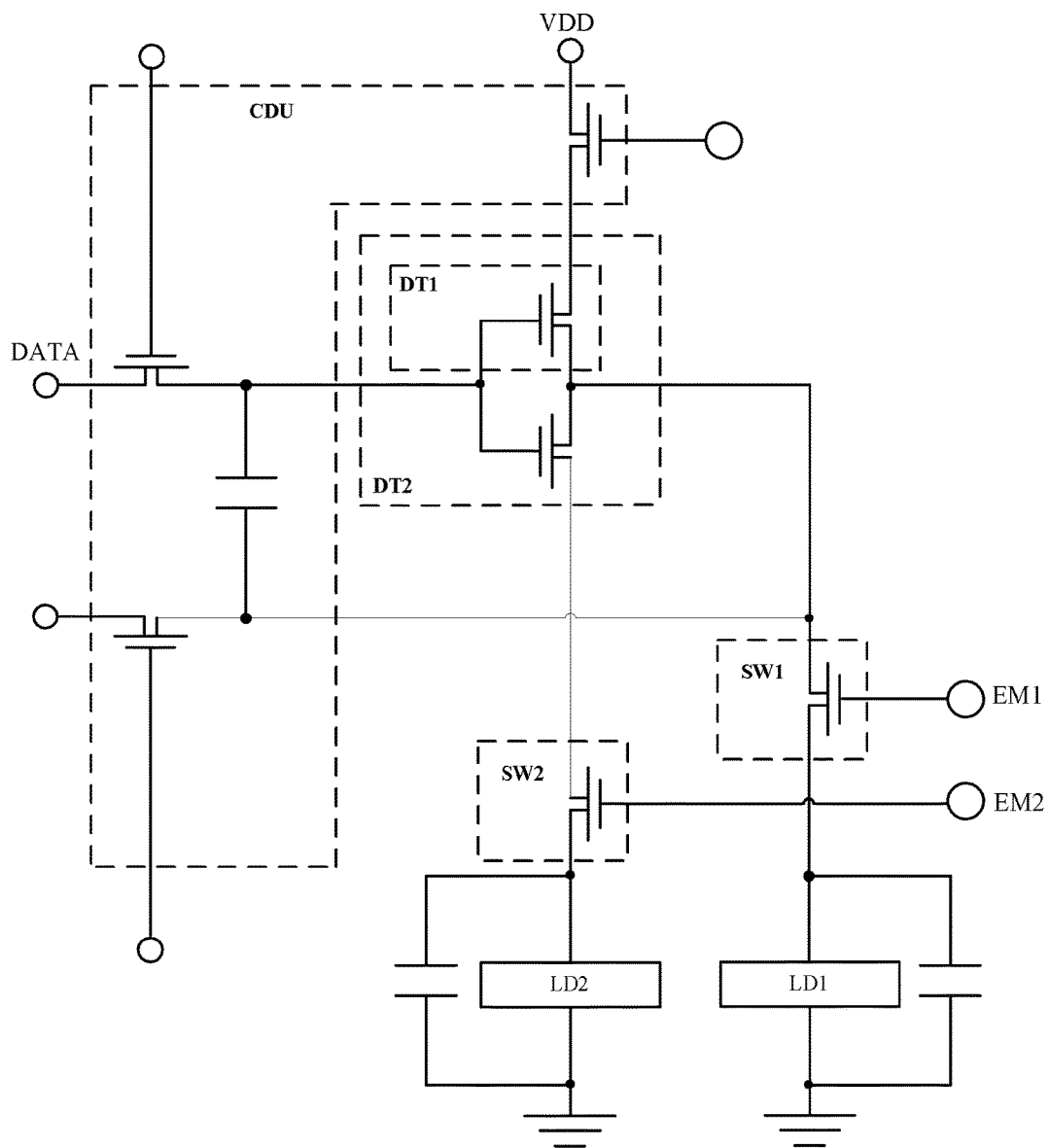
Figure 4D:
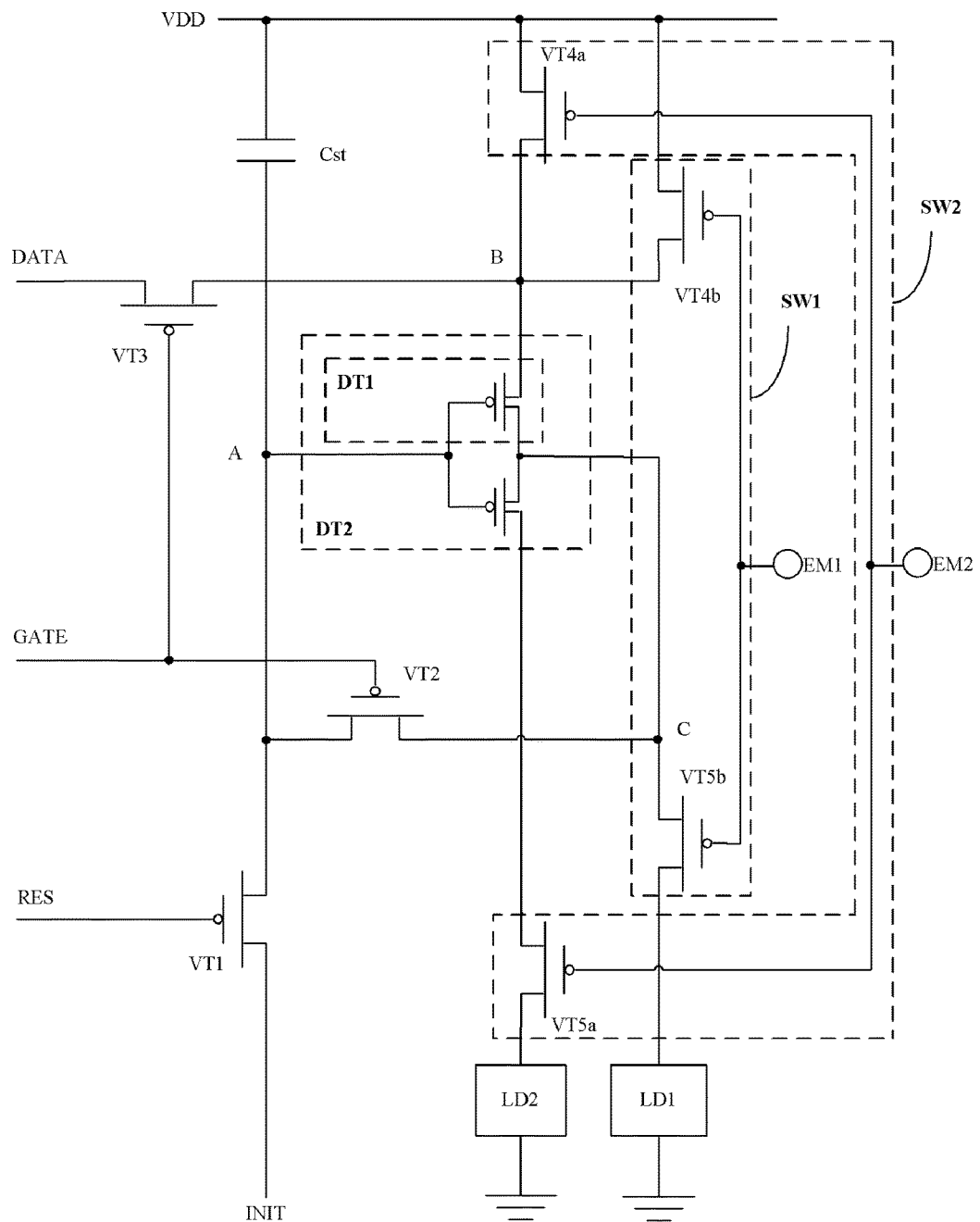

Further, if these three sub-pixel structures share the common driving unit CDU, the footprint of the driving circuit is 4C1+C2+3C1+3C1=10C1+C2. As compared with 15C1+3C2, the footprint is reduced by 5C1+2C2. FIGS. 4c and 4d show other example circuits of the pixel structure according to embodiments of the present disclosure.

The pixel structure as shown in FIG. 4c includes a first light-emitting device LD1, a second light-emitting device LD2, a common driving unit CDU, a first driving transistor DT1, a second driving transistor DT2, a first switch unit SW1 and a second switch unit SW2.

In an operation period of the first light-emitting device LD1, the first switch unit SW1 is turned on under control of EM1, and the second switch unit SW2 is turned off under control of EM2. Under control of driving signals (including a data voltage signal DATA, a power supply signal VDD, a gate scan signal, etc.) which are applied to the common driving unit CDU, the first light-emitting device LD1 emits light.

In an operation period of the second light-emitting device LD2, the first switch unit SW1 is turned off under control of EM1, and the second switch unit SW2 is turned on under control of EM2. Under control of driving signals (including a data voltage signal DATA, a power supply signal VDD, a gate scan signal, etc.) which are applied to the common driving unit CDU, the second light-emitting device LD2 emits light.

The pixel structure as shown in FIG. 4d includes a first light-emitting device LD1, a second light-emitting device LD2, a common driving unit CDU, a first driving transistor DT1, a second driving transistor DT2, a first switch unit SW1 and a second switch unit SW2.

Specifically, the common driving unit CDU includes a first transistor VT1, a second transistor VT2, a third transistor VT3 and a storage capacitor Cst. The first switch unit SW1 includes transistors VT4b and VT5b. The second switch unit SW2 includes transistors VT4a and VT5a.

In this pixel structure, operations of each of the first light-emitting device LD1 and the second light-emitting device LD2 include three phases: a reset phase, a data write phase and a light-emitting phase.

These three phases are described below taking the operations of the first light-emitting device LD1 as an example.

In the reset phase, a low level of a reset signal RES causes the first transistor VT1 to turn on. A first electrode plate of the storage capacitor Cst is supplied with the power supply voltage signal VDD, and a second electrode plate of the storage capacitor Cst is supplied with an initial voltage signal INIT. Due to an increase in the voltage difference between its first electrode plate and second electrode plate, the storage capacitor Cst is charged. At this point, the potential of node A is the same as the initial voltage signal INIT. As is shown, node A is connected to the common gate electrode of the first driving transistor DT1 and the second driving transistor DT2 and the second electrode plate of the storage capacitor Cst. A high level of the control signal GATE causes the second transistor VT2 and the third transistor VT3 to turn off. A high level of EM1 causes the transistors VT4b and VT5b to turn off.

In the data write phase, a high level of the reset signal RES causes the first transistor VT1 to turn off. A low level of the control signal GATE causes the second transistor VT2 and the third transistor VT3 to turn on. As the second transistor is turned on, the gate and drain of the first driving transistor DT1 that are connected respectively to the first electrode and second electrode of the second transistor VT2 are short-circuited. The first driving transistor DT1 operates in a diode mode, with only the PN junction between its source and drain being active. The third transistor VT3 is turned on, and transfers the data voltage signal DATA to the source of the first driving transistor DT1. At this point, the potential of node B is the same as the data voltage signal DATA. As is shown, node B is connected to the source of the first driving transistor DT1. As the first driving transistor DT1 is in the diode mode (where only the PN junction between its source and drain is active), the potential of node A then changes to VDATA+Vth, where VDATA is the potential of the data voltage signal DATA, and Vth is the threshold voltage of the PN junction. Due to a decrease in the voltage difference between its first electrode plate and second electrode plate, the storage capacitor Cst discharges. A high level of EM1 causes the transistors VT4b and VT5b to turn off.

In the light-emitting phase, the reset signal RES and the control signal GATE are at a high level, and thus the first transistor VT1, the second transistor VT2 and the third transistor VT3 are turned off. A low level of EM1 causes the transistors VT4b and VT5b to turn on. As the potential of node A maintains at VDATA+Vth, the first driving transistor DT1 is turned on and operates in the saturation region. The transistor VT4b, the first driving transistor DT1, the transistor VT5b, the first light-emitting device LD1 form a path, and the first driving transistor DT1 generates a driving current. At this point, the potential of node C is VOLED, where VOLED is the threshold voltage of the first light-emitting device LD1. As is shown, node C is connected to the drain of the first driving transistor DT1.

The driving current flowing through the first light-emitting device LD1 is calculated as:

$$\begin{aligned}
Id &= F(Vgs) \\
&= F(\text{the gate potential of the first driving transistor } DT1 - \\
&\quad \text{the source potential of the first driving transistor } DT1) \\
&= F(\text{the gate potential of the first driving transistor } DT1 - \\
&\quad (\text{the drain potential of the first driving transistor } DT1 + \\
&\quad \text{the voltage difference between the source and the drain} \\
&\quad \text{of the first driving transistor } DT1)) \\
&= F(\text{the potential of node A} - (\text{the potential of node C} + \text{the} \\
&\quad \text{voltage difference between the source and the drain of the} \\
&\quad \text{first driving transitor } DT1)) \\
&= F(VDATA + Vth - (VOLED + Vth)) \\
&= F(VDATA - VOLED),
\end{aligned}$$

where F(*) represents a function of a variable "*", and Vgs is a voltage across the gate and the source of the first driving transistor DT1.

It can be seen from the equation Id=F(VDATA−VOLED) that the magnitude of the driving current Id is irrelevant to the threshold voltage of the PN junction. Thus, the pixel structure according to embodiments of this disclosure can also compensate a deviation of the driving current resulting from drift of the threshold voltage of the driving transistor, and thus generate consistent driving currents. This may ensure the uniformity of luminance among the light-emitting devices.

Operations of the first light-emitting device LD1 have been described above. In the operation period of the second light-emitting device LD2, the second switch unit SW2 is turned on under control of EM2, and the first switch unit SW1 is turned off under control of EM1. For the sake of simplicity, detailed description of the operations of the second light-emitting device LD2 is omitted here.

According to another aspect of the present disclosure, a display device is provided which includes the pixel structure as described in the above embodiments.

According to yet another aspect of the present disclosure, a method is provided for driving such a pixel structure.

Figure 5:
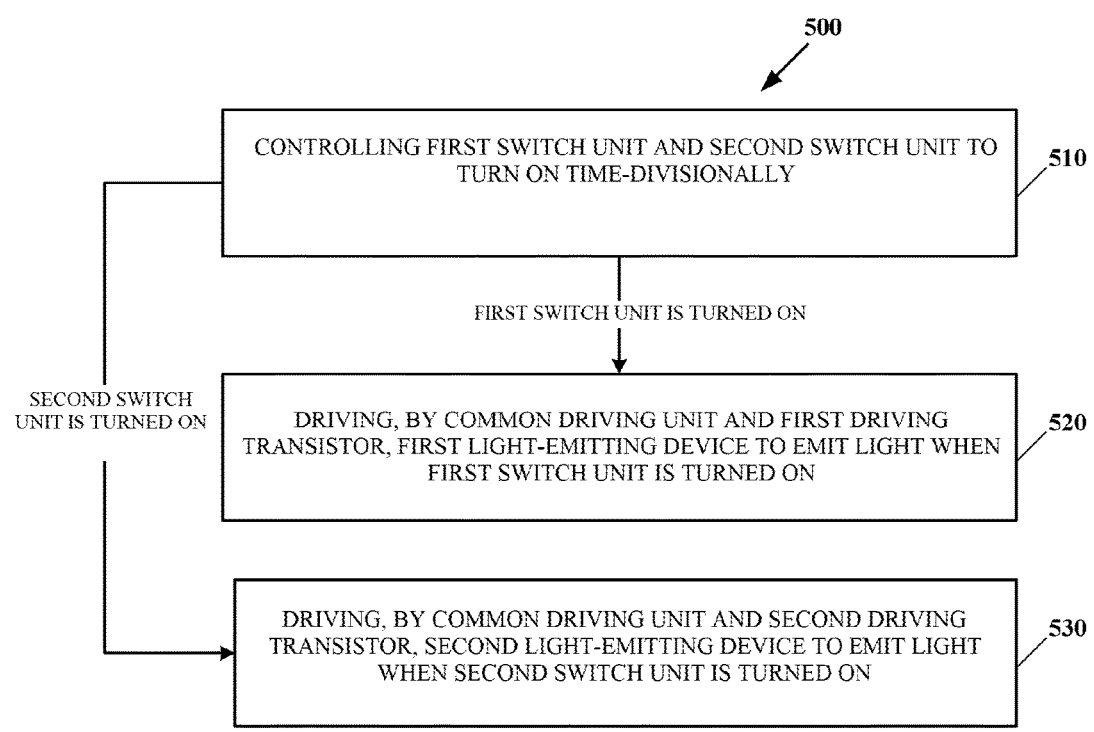
FIG. 5 is a flow chart of a method for driving a pixel structure, according to an embodiment of the present disclosure.

FIG. 5 is a flow chart of a method 500 for driving a pixel structure, according to an embodiment of the present disclosure.

At step 510, the first switch unit and the second switch unit are controlled to turn on time-divisionally.

At step 520, the common driving unit and the first driving transistor drive the first light-emitting device to emit light when the first switch unit is turned on.

At step 530, the common driving unit and the second driving transistor drive the second light-emitting device to emit light when the second switch unit is turned on.

In the case that the pixel structure further comprises a third light-emitting device having the same driving requirement as the first light-emitting device and a third switch unit operably coupled between the first driving transistor and the third light-emitting device, the method 500 further comprises the following operations:

controlling the first switch unit, the second switch unit and the third switch unit to turn on time-divisionally; and driving, by the common driving unit and the first driving transistor, the third light-emitting device to emit light when the third switch unit is turned on In the above embodiments, the transistors may be thin film transistors or field effect transistors or other transistors. In general, the transistors are fabricated such that their sources and drains are symmetric, and thus the sources and the drains can be used interchangeably.

In the above embodiments, the transistors in the circuits are illustrated and described as transistors of a specific type (either N-type or P-type). From these embodiments, substitution of a transistor of one type for a transistor of another type can be easily conceived of by a person skilled in the art, and thus the resultant embodiments also fall within the scope of the present disclosure.

Any elements together achieve the same function are effectively "associated" such that a desired function is achieved. Likewise, any two of such associated elements can be regarded as being "operably connected" or "operably coupled" with each other for the desired function.

It is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A pixel structure comprising:
a first light-emitting device;
a second light-emitting device having a different driving requirement from the first light-emitting device;
a common driving unit;
a first driving transistor operably coupled to the common driving unit for driving the first light-emitting device;
a second driving transistor operably coupled to the common driving unit for driving the second light-emitting device;
a first switch unit operably coupled between the first driving transistor and the first light-emitting device; and
a second switch unit operably coupled between the second driving transistor and the second light-emitting device,
wherein the second driving transistor has a channel width-to-length ratio smaller than that of the first driving transistor, the channel width-to-length ratio of the second driving transistor being adapted to the driving requirement of the second light-emitting device;
wherein the first switch unit and the second switch unit are configured to turn on time-divisionally;
wherein the first driving transistor has a first channel region, the second driving transistor has a second channel region, and the first channel region is reused as a part of the second channel region; and
wherein the first driving transistor and the second driving transistor have a common gate electrode and a common first electrode, the first driving transistor has a second electrode, the second driving transistor has a second electrode, the first channel region is configured to provide, upon conduction of the first driving transistor, an electrical connection between the common first electrode and the second electrode of the first driving transistor, and the second channel region is configured to provide, upon conduction of the second driving transistor, an electrical connection between the common first electrode and the second electrode of the second driving transistor.

2. The pixel structure of claim 1, wherein the first driving transistor and the second driving transistor are of a bottom gate type.

3. The pixel structure of claim 1, wherein the first driving transistor and the second driving transistor are of a top gate type.

4. The pixel structure of claim 3, wherein the common gate electrode comprises a first part and a second part that are spaced from each other in a length direction of the first channel region and the second channel region, wherein the first part defines an effective length of the first channel region, and wherein the first part together with the second part defines an effective length of the second channel region.

5. The pixel structure of claim 1, further comprising:
a third light-emitting device having the same driving requirement as the first light-emitting device; and
a third switch unit operably coupled between the first driving transistor and the third light-emitting device,
wherein the first switch unit, the second switch unit and the third switch unit are configured to turn on time-divisionally.

6. The pixel structure of claim 5, wherein the first light-emitting device is a red OLED, the second light-emitting device is a blue OLED, and the third light-emitting device is a green OLED.

7. A display device comprising the pixel structure as recited in claim 1.

8. A method for driving the pixel structure as recited in claim 1, the method comprising:
controlling the first switch unit and the second switch unit to turn on time-divisionally;
driving, by the common driving unit and the first driving transistor, the first light-emitting device to emit light when the first switch unit is turned on; and
driving, by the common driving unit and the second driving transistor, the second light-emitting device to emit light when the second switch unit is turned on.

9. The method of claim 8, wherein the pixel structure further comprises a third light-emitting device having the same driving requirement as the first light-emitting device and a third switch unit operably coupled between the first driving transistor and the third light-emitting device, the method further comprising:
controlling the first switch unit, the second switch unit and the third switch unit to turn on time-divisionally; and
driving, by the common driving unit and the first driving transistor, the third light-emitting device to emit light when the third switch unit is turned on.

10. A display device comprising the pixel structure as recited in claim 2.

11. A display device comprising the pixel structure as recited in claim 3.

12. A display device comprising the pixel structure as recited in claim 4.

13. A display device comprising the pixel structure as recited in claim 5.

14. A display device comprising the pixel structure as recited in claim 6.

* * * * *